(12) United States Patent
Yamamoto et al.

(10) Patent No.: US 9,286,833 B2
(45) Date of Patent: *Mar. 15, 2016

(54) BUFFER CIRCUIT, SCANNING CIRCUIT, DISPLAY DEVICE, AND ELECTRONIC EQUIPMENT

(71) Applicant: JOLED Inc., Tokyo (JP)

(72) Inventors: Tetsuro Yamamoto, Kanagawa (JP); Katsuhide Uchino, Kanagawa (JP)

(73) Assignee: JOLED Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/528,421

(22) Filed: Oct. 30, 2014

(65) Prior Publication Data

US 2015/0054802 A1  Feb. 26, 2015

Related U.S. Application Data

(63) Continuation of application No. 13/665,310, filed on Oct. 31, 2012, now Pat. No. 8,884,863.

(30) Foreign Application Priority Data

Nov. 11, 2011  (JP) ................. 2011-247140

(51) Int. Cl.
  *G09G 3/32*  (2006.01)
  *H03K 3/3565*  (2006.01)
  *H03K 19/0185*  (2006.01)
(52) U.S. Cl.
  CPC ............ *G09G 3/3266* (2013.01); *G09G 3/32* (2013.01); *G09G 3/3233* (2013.01); *H03K 3/3565* (2013.01); *H03K 19/0185* (2013.01); *G09G2310/0286* (2013.01); *G09G 2310/0291* (2013.01)

(58) Field of Classification Search
  CPC .................. G09G 3/32; G09G 3/3266; G09G 2310/0267; G09G 2310/0291
  USPC ............... 330/310–311; 345/8–100, 304–210
  See application file for complete search history.

(56) References Cited

U.S. PATENT DOCUMENTS

2008/0129660 A1   6/2008  Iida et al.

FOREIGN PATENT DOCUMENTS

| CN | 1614674 A | 5/2005 |
| CN | 101183504 A | 5/2008 |
| CN | 101355353 A | 1/2009 |
| CN | 101494019 A | 7/2009 |
| JP | 2007-310311 A | 11/2007 |

OTHER PUBLICATIONS

Chinese Office Action issued Sep. 25, 2015 for corresponding Chinese Application No. 201210446966.9.

*Primary Examiner* — Michael Pervan
(74) *Attorney, Agent, or Firm* — Michael Best & Friedrich LLP

(57) ABSTRACT

A buffer circuit includes a first transistor circuit having a first conductivity type transistor, a second transistor circuit having a second conductivity type transistors, in which the first and second transistor circuits are serially connected between a first fixed power supply and a second fixed power supply, and input terminals and output terminals of each of the first and second transistor circuits are connected in common respectively, in which at least one transistor circuit of the first transistor circuit and the second transistor circuit is a double gate transistor, and in which wherein a switch element, when any one transistor circuit of the first and the second transistor circuits is in an operating state, is included to supply a voltage of a third fixed power supply to a common connection node of the double gate transistor of the other transistor circuit.

20 Claims, 8 Drawing Sheets

BUFFER CIRCUIT, SCANNING CIRCUIT, DISPLAY DEVICE, AND ELECTRONIC EQUIPMENT

CROSS REFERENCE APPLICATION

This is a Continuation of Application of application Ser. No. 13/665,310, filed on Oct. 21, 2012, now U.S. Pat. No. 8,884,863 which issued on Nov. 11, 2014, which contains subject matter related to Japanese Patent Application No. JP 2011-247140 filed in the Japan Patent Office on Nov. 11, 2011. All of the above applications are incorporated herein by reference.

BACKGROUND

The present disclosure relates to a buffer circuit, a scanning circuit, a display device and electronic equipment.

As one of the plane-type display devices (flat panel type), there is a device which a light emission luminance changes depending on a value of a current flowing in the device and uses a so-called current driven-type electro-optic element as a light emitting element of pixel. As the current driven-type electro-optic element, for example, there has been known an organic electroluminescence (EL) element which uses the EL of an organic material and uses a phenomenon in which light is emitted when an electric field is applied to an organic film.

The organic EL display device using the organic EL element as for a light emitting section of the pixel has the following preferable features. In other words, the organic EL element has low power consumption because the organic EL element can be driven by application of voltage 10 V or lower. Since the organic EL element is a self-light emitting element, visibility of image is high compared to a liquid crystal display device, and further, since it is not necessary to prepare any illumination component such as a backlight, it is easy to accomplish a weight lightening and a thickness thinning. Furthermore, the organic EL element does not leave a residual image when displaying the moving image because a response speed is very high at about several µsec order.

The plane-type display device is representative of the organic EL display device has a configuration such that pixels each having at least a write transistor, a storage capacitor and a drive transistor other than an electro-optic element are disposed in two-dimensional matrix form (for example, refer to Japanese Unexamined Patent Application Publication No. 2007-310311).

In such a display device, the write transistor is driven by a control pulse (scanning pulse) which is supplied from a scanning circuit (scanning section) through a control line (scanning line) wired for every pixel row, thereby the signal voltage of the video signal supplied through a signal line is written in a pixel. The storage capacitor retains the signal voltage that the write transistor has written. The drive transistor drives the electro-optic element according to the signal voltage retained in the storage capacitor.

SUMMARY

By the way, generally, when the display panel is upsized, since the load of the control line, that is, a load, when the control pulse is transmitted from the scanning circuit to the write transistor, becomes larger, a waveform of the pulse becomes greatly dull due to the influence of the load. In order to suppress the influence of the load, it had been considered to increase the size of a transistor constituting the inverter circuit of the final stage in the buffer circuit (output buffer circuit) of the output stage of the scanning circuit and thus to lower the resistance of the inverter circuit. However, if the size of the transistor is increased, since the circuit scale of a scanning circuit and the peripheral circuits including the scanning circuit grows large subsequently, it might interfere with narrowing a frame of the display panel.

Accordingly, it becomes necessary to keep the size of a transistor constituting the inverter circuit of the final stage intact. In other words, it is necessary to lower the resistance (resistance of a transistor constituting an inverter circuit) of the inverter circuit of the final stage without increasing the size of the transistor. Generally, the resistance value of the transistor depends on the size of the transistor and the voltage between the gate and the source. Therefore, in order to not increase the size of a transistor constituting the inverter circuit of the final stage, it is necessary to raise the voltage between the gate and the source of the transistor, in other words, to increase amplitude of the input voltage of the inverter circuit of the final stage.

In order to raise the voltage between the gate and the source of a transistor constituting the inverter circuit of the final stage, it is necessary to raise the power supply voltage which is supplied to the inverter circuit of a pre-stage of the inverter circuit of the final stage higher than the input voltage. However, simply, when the power supply voltage which is supplied to the inverter circuit of the pre-stage of the inverter circuit of the final stage is raised higher than the input voltage, the voltage between the source and the drain of the transistor constituting the inverter circuit of the pre-stage raises high and exceeds a predetermined source-drain breakdown voltage.

Generally, the source-drain breakdown voltage of the transistor is smaller than the gate-source breakdown voltage (low). Accordingly, when the source-drain breakdown voltage which hangs to the transistor constituting the inverter circuit of the pre-stage exceeds a predetermined source-drain breakdown voltage, the reliability of the transistor decreases remarkably.

Accordingly, it is desirable to provide a buffer circuit which is able to increase the amplitude of the input voltage of the inverter circuit of the final stage, a scanning circuit which uses the buffer circuit in an output stage, a display device equipped with the scanning circuit, and an electronic equipment having the display device, with the source-drain breakdown voltage of a transistor constituting a circuit maintained.

According to an embodiment of the present disclosure, there is provided a buffer circuit of the present disclosure, which includes a first transistor circuit having a first conductive type transistor, a second transistor circuit having a second conductive type transistors, in which the first and second transistor circuits are serially connected between a first fixed power supply and a second fixed power supply, and input terminals and output terminals of each of the first and second transistor circuits are connected in common respectively, in which at least one transistor circuit of the first transistor circuit and the second transistor circuit is a double gate transistor and in which a switch element, when any one transistor circuit of the first and the second transistor circuits is in an operating state, is included to supply a voltage of a third fixed power supply to a common connection node of the double gate transistor of the other transistor circuit. The buffer circuit of the present disclosure may be used as a buffer circuit of the output stage in a scanning circuit which outputs a scanning signal to scan pixels disposed in a matrix form. In addition, the scanning circuit which has a buffer circuit of the present disclosure in the output stage may be used as a display device in which pixels are disposed in a matrix form, or as a scanning circuit which scans each pixel in a solid imaging device. In addition, the display device equipped with a scanning circuit having a buffer circuit of the present disclosure in the output stage may be used as a display section in various kinds of electronic equipment having the display section.

In the buffer circuit of the constitution mentioned above, the first transistor circuit and the second transistor circuit may be serially connected between the first fixed power supply and the second fixed power supply, thereby, for example, when the first transistor circuit which is one transistor circuit is in an operating state, the voltage of an output stage may become the voltage of the first fixed power supply. In this way, with regard to the second transistor circuit too, to which the voltage of the first fixed power supply and the voltage of the second fixed power supply is supplied.

At this time, for example, to a common connection node of the double gate transistors of the second transistor circuit that is the other transistor circuit, the voltage of the third fixed power supply may be supplied by a switch element. In this way, between each of sources and drains of two transistors constituting double gate structure, a voltage between the first fixed power supply and the second fixed power supply is not supplied, but a voltage between the first fixed power supply and the third fixed power supply, and a voltage between the third fixed power supply and the second fixed power supply are supplied.

Herein, the voltage between the first fixed power supply and the third fixed power supply, and the voltage between the third fixed power supply and the second fixed power supply may become voltages within a range of the source-drain breakdown voltage of each of transistors constituting the first and the second transistor circuits. In this way, the voltage between the source and the drain applied to the transistor becomes lower than the breakdown voltage thereof and thus, the output voltage having the amplitude which is larger than the amplitude of the input voltage can be derived.

According to this disclosure, it is possible to increase the amplitude of the input voltage of the inverter circuit of the final stage with the source-drain breakdown voltage of the transistor maintained because the voltage between the source and the drain of the transistor can be lower than the breakdown voltage thereof and to derive the output voltage having the amplitude which is larger than the amplitude of the input voltage.

DETAILED DESCRIPTION OF EMBODIMENTS

Figure 1:
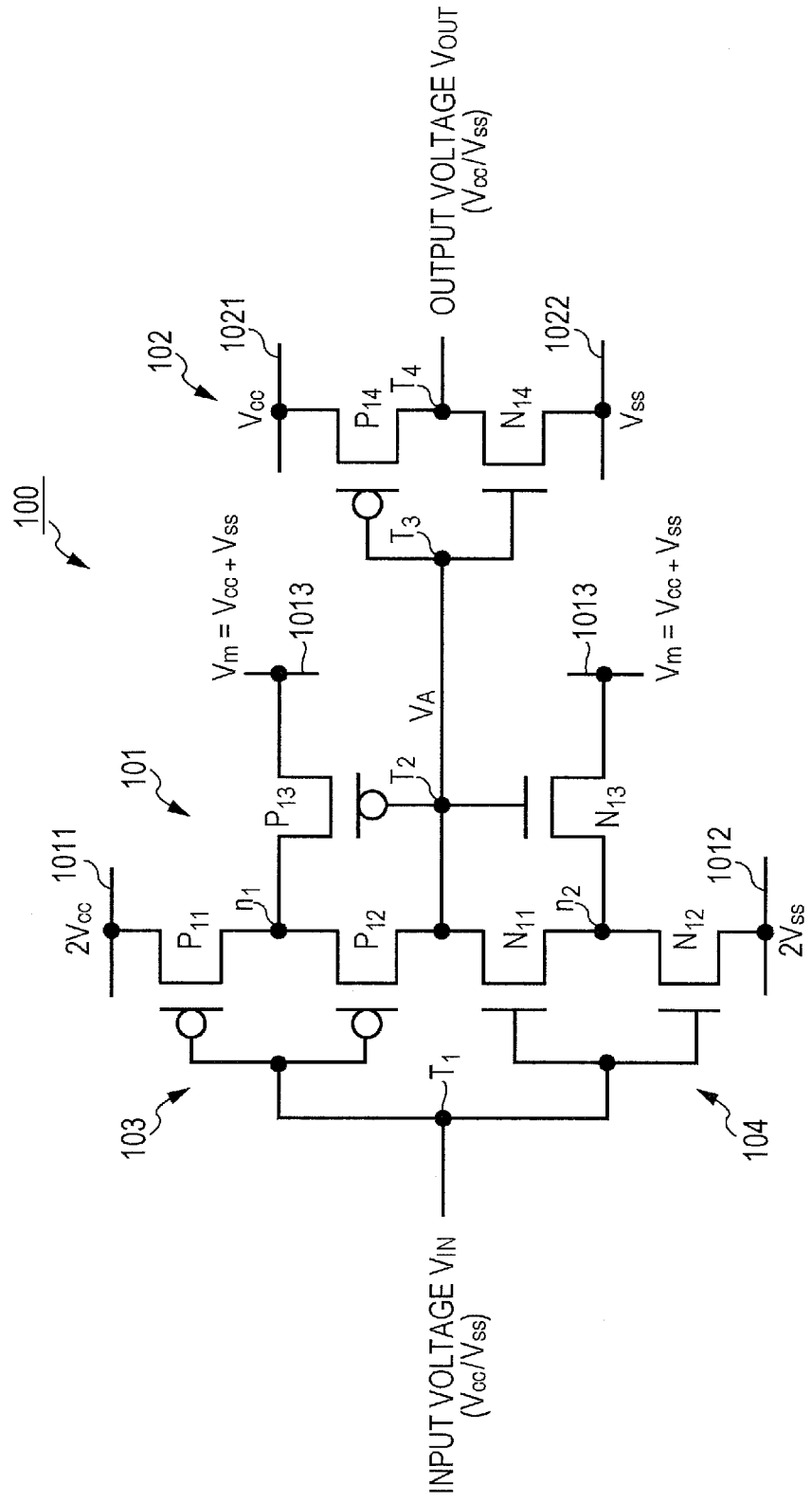
FIG. 1 is a circuit diagram illustrating a configuration example of a buffer circuit according to an embodiment of the present disclosure.

Hereinafter, a form (refer to "embodiment") to implement a technique of the present disclosure will be disclosed using drawings in detail. The present disclosure is not limited to the embodiment. In the following disclosure, the same reference numerals are used for the same elements or elements having the same function, and the repetitive description thereto will be omitted. In addition, description will be performed by the following order.

1. Description regarding a buffer circuit of the present disclosure and the whole thereof
2. Buffer circuit according to an embodiment
2-1. Circuit configuration
2-2. Circuit operation
2-3. Operation and effect of an embodiment
3. Display device (organic EL display device)
3-1. System configuration 3-2. Pixel circuit
3-3. Scanning circuit
3-4. The others
4. Electronic equipment
5. Configuration of the present disclosure <1. Description Regarding a Buffer Circuit of the Present Disclosure and the Whole Thereof>

A buffer circuit of the present disclosure includes a CMOS inverter circuit configuration such that a first transistor circuit including a first conductive type transistors and a second transistor circuit including a second conductive type transistors are serially connected, and input terminals and output terminals of each transistor circuit are connected in common respectively.

In the buffer circuit of the CMOS inverter circuit configuration, the first transistor circuit and the second transistor circuit are serially connected between a first fixed power supply and a second fixed power supply. Then, at least one transistor circuit of the first transistor circuit and the second transistor circuit includes transistors having the double gate structure, namely, double gate transistors.

The buffer circuit of the present disclosure has the circuit configuration including the combination with the inverter circuit of final stage, in other words, it may be a configuration that the input terminals of the inverter circuit of the final stage are connected to each output terminal of the first and the second transistor circuits. At this time, it is desirable to assume that the voltage of the first fixed power is the voltage that is higher than the voltage of the positive side power supply of the inverter circuit of the final stage, and the voltage of the second fixed power is the voltage that is lower than the voltage of the negative side power supply of the inverter circuit of the final stage.

Then, when any one transistor circuit of the first and the second transistor circuits is in operating state, the buffer circuit of the present disclosure has feature of having a switch element which gives a common connection node of the double gate transistors of the other transistor circuit the voltage of a third fixed power supply selectively.

The voltage of the third fixed power supply is a value between each voltage of the first and the second fixed power supplies, and it is desirable to assume that the average value of each voltage of the first and the second fixed power supplies is supplied. The switch element giving the voltage of the third fixed power supply selectively may be the same conductive-type transistor as the other transistor constituting the inverter circuit. The transistor of the same conductive type is installed such that a gate electrode is connected to the output terminal of the buffer circuit, one source/drain electrode is connected to the third fixed power supply, and the other source/drain electrode is connected to the common connection node of the double gate transistors, respectively.

Here, it is preferable that the voltage of the first fixed power supply is the voltage that is higher than the voltage of the higher voltage side of the input voltages that is applied (is input) to each input terminal of the first and the second transistor circuits, that is, to the input terminal of the buffer circuit and the voltage of the second fixed power supply is to be lower than the voltage of the lower voltage side of the input voltages. In this way, it is possible to raise the voltage between the gate and the source without increasing the size of a transistor constituting the inverter circuit, since raising the power supply voltage, that is given to a buffer circuit of the present disclosure that is the inverter circuit of the pre-stage of the inverter circuit of the final stage, greater than the input voltage corresponds to lowering the resistance of the inverter circuit 102 of the final stage.

In addition, it is desirable that the voltage between the first fixed power supply and the third fixed power supply and the voltage between the third fixed power supply and the second fixed power supply are the voltage within a range of the source-drain breakdown voltage of each transistor constituting the first and the second transistor circuits. By performing such a voltage setting, the voltage between the source and the drain which is given to each transistor constituting the first and the second transistor circuits becomes equal to or lower than the breakdown voltage thereof and further, the output voltage having the amplitude that is larger than the amplitude of the input voltage can be derived.

The buffer circuit of the present disclosure may be used for various kinds of usages as a general buffer circuit without any limitation. As an example, the buffer circuit of this disclosure, in a scanning circuit outputting a scanning signal which scans pixels disposed in a matrix form, may be used as a buffer circuit of the output stage.

In addition, the scanning circuit having a buffer circuit of the present disclosure in an output stage may be used as a scanning circuit which scans each pixel, in the display device in which the pixels each including the electro-optic element are disposed in a in a matrix form or in the solid imaging device which the pixels including a photoelectric conversion element are disposed in a matrix form. In this case, the scanning circuit can take a form that is mounted on the display panel or can take a form that is disposed outside the display panel as a driver IC. In addition, the display device equipped with a scanning circuit having a buffer circuit of the present disclosure in an output stage can be used as a display section in various kinds of electronic equipment which is provided with the display section.

<2. Buffer Circuit According to an Embodiment>

[2-1. Circuit Constitution]

FIG. 1 shows a circuit diagram illustrating a configuration example of a buffer circuit according to an embodiment of the present disclosure. The buffer circuit 100 according to this embodiment includes two stages such that the inverter circuit 101 of the pre-stage and the inverter circuit 102 of the latter stage (final stage) are connected in cascade. The inverter circuit is not limited to the two stages of constitution, but may be constitution more than three stages that an inverter circuit is further connected in cascade at the pre-stage side of the inverter circuit 101 of the pre-stage.

Input voltage $V_{IN}$ in which the voltage (high level) of the higher voltage side is $V_{cc}$ and the voltage (low level) of the lower voltage side is $V_{ss}$ is input to the buffer circuit 100 according to the present embodiment. With respect to the input voltage $V_{IN}$, the first fixed power supply 1011 of the inverter circuit 101 of the pre-stage, in other words, the voltage of the positive side power supply assumes the voltage that is higher than the voltage $V_{cc}$ of the higher voltage side of input voltage $V_{IN}$, for example, 2 $V_{cc}$, and the second fixed power supply 1012, in other words, the voltage of the negative side power supply assumes the voltage equal to or lower than the voltage $V_{ss}$ of the lower voltage side of input voltage $V_{IN}$, for example, 2 $V_{ss}$. It may be a case where 2 $V_{ss}$=$V_{ss}$.

Here, increasing the power supply voltage (2 $V_{cc}$, 2 $V_{ss}$) to be given the inverter circuit 101 of the pre-stage greater than input voltage $V_{IN}$ corresponds to lowering the resistance of the inverter circuit 102 of the final stage. This is because the voltage between the gate and the source is raised with the size of the transistor constituting inverter circuit 102 intact. In addition, here, the source-drain breakdown voltage of each transistor constituting the inverter circuit 101 of the pre-stage is considered as ($V_{cc}$-$V_{ss}$).

In FIG. 1, the inverter circuit 101 of the pre-stage has a configuration that the first and the second transistor circuits 103, 104 are connected serially to between the first fixed power supply 1011 and the second fixed power supply 1012. The first transistor circuit 103 includes the first conductive type transistors, and the second transistor circuit 104 includes the second conductive type transistors. Here, P channel type transistor is used as the first conductive type transistor and N channel type transistor is used as the second conductive type transistor.

At least one transistor circuit of the first and the second transistor circuits 103 and 104 include double gate structure transistors, in other words, the double gate transistors. When any one transistor circuit is double-gate transistor, the other transistor circuit has a single-gate transistor. In this embodiment, a case of the constitution which both sides of the first and the second transistor circuits 103 and 104 have double gate transistors as an example is proposed and disclosed.

The first transistor circuit 103 is made such that gate electrodes are connected to each the other in common, and constituted with the first and the second P channel transistors $P_{11}$ and $P_{12}$ of double gate structure connected to input terminal $T_1$. Here, "input terminal $T_1$" indicates an input terminal of the inverter circuit 101 of the pre-stage to which input voltage $V_{IN}$ is given. The first p channel transistor $P_{11}$ is made such that a source electrode is connected to the first fixed power supply 1011.

The second P channel transistor $P_{12}$ is made such that a drain electrode is connected to output terminal $T_2$. Here, "output terminal $T_2$" indicates an output terminal of the inverter circuit 101 of the pre-stage. Then, a drain electrode of the first P channel transistor $P_{11}$ and a source electrode of the second P channel transistor $P_{12}$ are connected in common to be a common connection node $n_1$ of the double gate transistors.

The second transistor circuit 104 is made such that gate electrodes are connected to each the other in common, and, constituted with the first and the second N channel transistors $N_{11}$ and $N_{12}$ of double gate structure connected to input terminal $T_1$. The first P channel transistor $N_{11}$ is made such that a drain electrode is connected to output terminal $T_2$. The second P channel transistor $P_{12}$ is made such that a source electrode is connected to the second fixed power supply 1012. Then, a source electrode of the first N channel transistor $N_{11}$ and a drain electrode of the second N channel transistor $N_{12}$ is connected in common each the other to be with the common connection node $n_2$ of the double gate transistors.

In addition, the input terminal $T_1$ of the inverter circuit 101 of the pre-stage is the input terminal where is common to the first and second transistor circuits 103 and 104, and becomes the input terminal of the buffer circuit 100. The output terminal $T_2$ of the inverter circuit 101 of the pre-stage is an output terminal where is common to the first and second transistor circuits 103 and 104. In other words, the common connection point (node) between the drain electrode of P channel transistor $P_{12}$ and the drain electrode of N channel transistor $N_{11}$ becomes the output terminal $T_2$ of the first and second transistor circuits 103 and 104.

As clear from the above, the inverter circuit 101 of the pre-stage has a CMOS inverter configuration such that the first transistor circuit 103 includes P channel transistors ($P_{11}$, $P_{12}$) of the double gate structure, and the second transistor circuit 104 includes N channel transistors ($N_H$, $N_{12}$) of the double gate structure.

Between the common connection node $n_1$ of a double gate transistors ($P_{11}$, $P_{12}$) constituting the first transistor circuit 103 and the third fixed power supply 1013, a switch element, for example, P channel transistor $P_{13}$ which has the same conductive type as the transistor constituting the first transistor circuit 103 is connected. P channel transistor $P_{13}$ is made such that a gate electrode is connected to output terminal $T_2$ of the inverter circuit 101 of the pre-stage, and one source/drain electrode is connected to the common connection node $n_1$ of the double gate transistors ($P_{11}$, $P_{12}$), and the other source/drain electrode is connected to the third fixed power supply 1013.

Then, when the second transistor circuit 104 becomes an operating state, P channel transistor $P_{13}$ becomes in a conduction (on) state and gives the common connection node $n_1$ of a double gate transistors ($P_{11}$, $P_{12}$) constituting first transistor circuit 103 voltage $V_m$ of third fixed power supply 1013. Here, "when the second transistor circuit 104 is in an operating state" indicates when N channel transistor ($N_{11}$, $N_{12}$) is in a conduction state.

Between the common connection node $n_2$ of a double gate transistors ($N_{11}$, $N_{12}$) constituting the second transistor circuit 104 and the third fixed power supply 1013, a switch element, for example, N channel transistor $N_{13}$ having the same conductive type as the transistor constituting the second transistor circuit 104 is connected. N channel transistor $N_{13}$ is made such that a gate electrode is connected to output terminal $T_2$ of the inverter circuit 101 of the pre-stage, and one source/drain electrode is connected to the common connection node $n_2$ of the double gate transistors ($N_{11}$, $N_{12}$), and the other source/drain electrode is connected to the third fixed power supply 1013.

Then, when the first transistor circuit 103 becomes an operating state, the N channel transistor $N_{13}$ is made such that the first transistor circuit 103 gives the common connection node $n_2$ of a double gate transistors ($N_{11}$, $N_{12}$) constituting the second transistor circuit 104 voltage $V_m$ of the third fixed power supply 1013. Here, "when the first transistor circuit 103 is in an operating state" indicates when P channel transistor ($P_{11}$, $P_{12}$) is in a conduction state.

As voltage $V_m$ of the third fixed power supply 1013, a value between each voltage of the first and the second fixed power supply 1011 and 1012, preferably, the average value of each of voltages $2V_{cc}$ and $2V_{ss}$ of the first and the second fixed power supply 1011 and 1012 are used. In addition, the voltage between the first fixed power supply 1011 and the third fixed power supply 1013, and the voltage between the third fixed power supply 1013 and the second fixed power supply 1012 assume the voltage within the source-drain breakdown voltage ($V_{cc}$-$V_{ss}$) of each transistor constituting the first and the second transistor circuits 103 and 104.

The inverter circuit 102 of the final stage becomes the CMOS inverter circuit configuration including P channel transistor $P_{14}$ and N channel transistor $N_{14}$. In other words, P channel transistor $P_{14}$ and N channel transistor $N_{14}$ are serially connected between the positive side power supply 1021 and the negative side power supply 1022.

Then, in the case of this example, the voltage of the positive side power supply 1021 is set to voltage $V_{cc}$ that is same as the higher voltage side of input voltage $V_{IN}$, the voltage of the negative side power supply 1022 is set to voltage $V_{ss}$ that is same as the lower voltage side of input voltage $V_{IN}$ each. In this way, voltage $2V_{cc}$ of the first fixed power supply 1011 of the inverter circuit 101 of the pre-stage becomes higher than voltage $V_{cc}$ of the positive side power supply 1021 of the inverter circuit 102 of the final stage, and voltage $2V_{ss}$ of the second fixed power supply 1012 becomes equal to or lower than voltage $V_{ss}$ of the negative side power supply 1022 of the inverter circuit 102 of the final stage.

The gate electrodes of P channel transistor $P_{14}$ and N channel transistor $N_{14}$ are connected in common to be an input terminal $T_3$ of the inverter circuit 102 which is connected to the output terminal $T_2$ of the inverter circuit 101 of the pre-stage. In addition, the drain electrodes of P channel transistor $P_{14}$ and N channel transistor $N_{14}$ are connected in common to be an output terminal $T_4$ of this the inverter circuit 102. The output terminal $T_4$ of the inverter circuit 102 of the final stage becomes the output stage of the buffer circuit 100. Then, from this output terminal $T_4$, an output voltage $V_{OUT}$ that the amplitude is $V_{cc}$-$V_{ss}$, in other words, the higher voltage side is voltage $V_{cc}$, and the lower voltage side is voltage $V_{ss}$ is derived.

[2-2. Circuit Operation]

Successively, the circuit operation of the buffer circuit 100 according to the embodiment of the constitution mentioned above will be disclosed using FIGS. 2 and 3. In addition, in FIG. 4, each waveform of input voltage $V_{IN}$ of the buffer circuit 100, electric potential (output electric potential) $V_A$ of the output terminal $T_3$ of the inverter circuit 101 of the pre-stage, and an output voltage $V_{OUT}$ of the buffer circuit 100 are illustrated.

Figure 2:
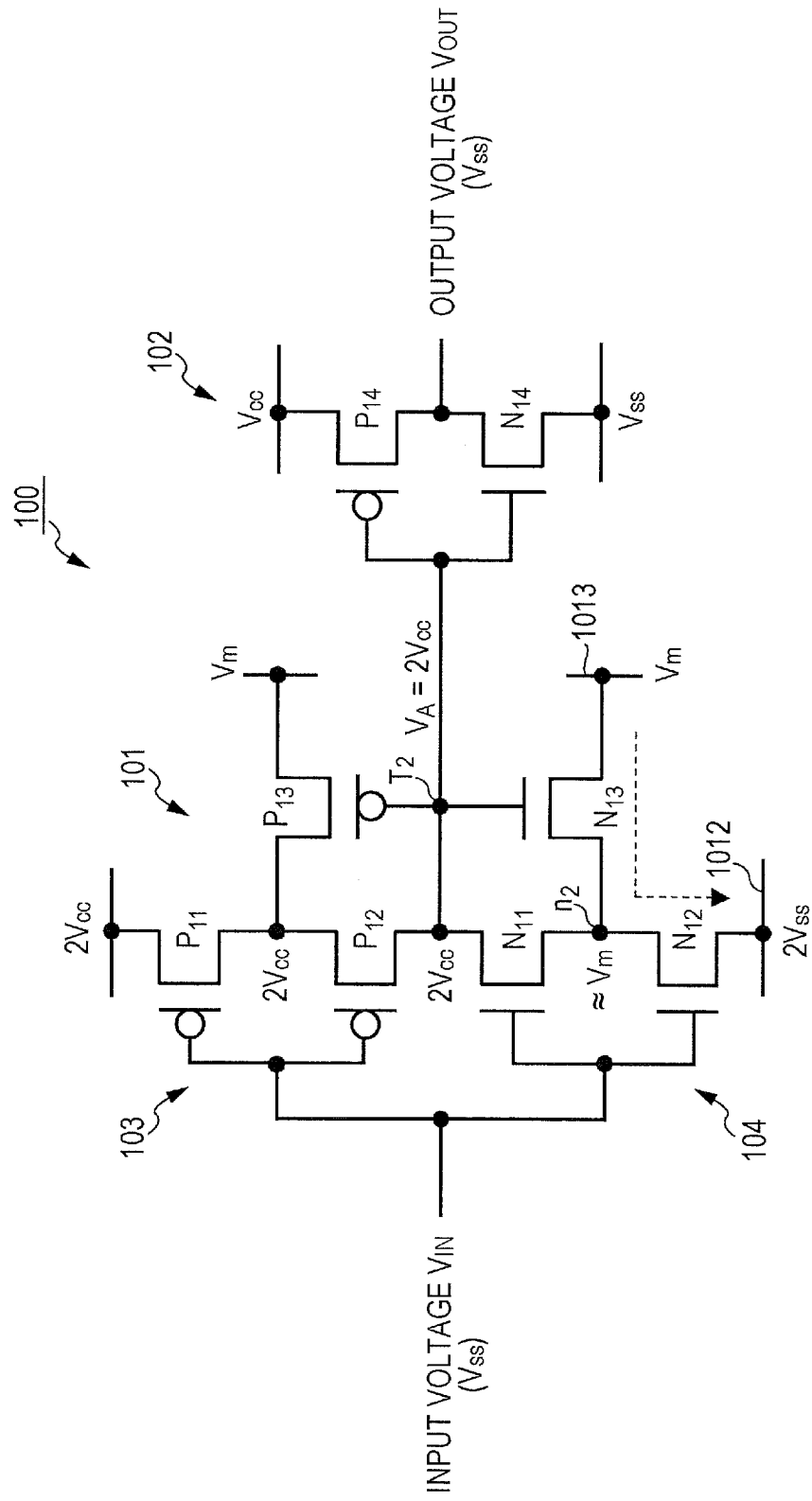
FIG. 2 is a diagram illustrating circuit operation of a case where input voltage $V_{IN}$ is low level $V_{ss}$.

At first, the circuit operation of case where input voltage $V_{IN}$ is a lower voltage (low level) $V_{ss}$, will be described using an operation illustration diagram of FIG. 2.

When input voltage $V_{IN}$ is low level $V_{ss}$, the P channel double gate transistors $P_{11}$, $P_{12}$ of the first transistor circuit 103 and N channel transistor $N_{12}$ of the negative power supply side of the second transistor circuit 104 is in conduction (on) state. Thereupon, electric potential $V_A$ of the output terminal $T_2$ of the inverter circuit 101 of the pre-stage rises.

Then, when electric potential $V_A$ of the output terminal $T_2$ of the inverter circuit 101 of the pre-stage becomes equal to or more than (voltage $V_M$ of the third fixed power supply 1013+a threshold voltage of N channel transistor $N_{13}$), N channel transistor $N_{13}$ becomes the conduction state. In this way, as shown with an arrow of the dashed line in FIG. 2, a penetration current flows through a path of the third fixed power supply 1013→N channel transistor $N_{13}$→N channel transistor $N_{12}$→the second fixed power supply 1012.

Here, the electric potential of the common connection node $n_2$ of the double gate transistors $N_{11}$ and $N_{12}$ of the second transistor circuit 104 can become approximately voltage $V_m$ of the third fixed power supply 1013 by the voltage between each gate and source of N channel transistor $N_{12}$, $N_{13}$ and the size. At this time, the voltage between the source and drain of each of transistors $N_H$, $N_{12}$ and $N_{13}$ of the second transistor circuit 104 side becomes ($V_{cc}$-$V_{ss}$) at the maximum. Accordingly, voltages between the source and the drain of transistors $N_H$, $N_{12}$ and $N_{13}$ do not excess the source-drain breakdown voltages ($V_{cc}$-$V_{ss}$) of the transistors $N_{11}$, $N_{12}$ and $N_{13}$.

Figure 3:
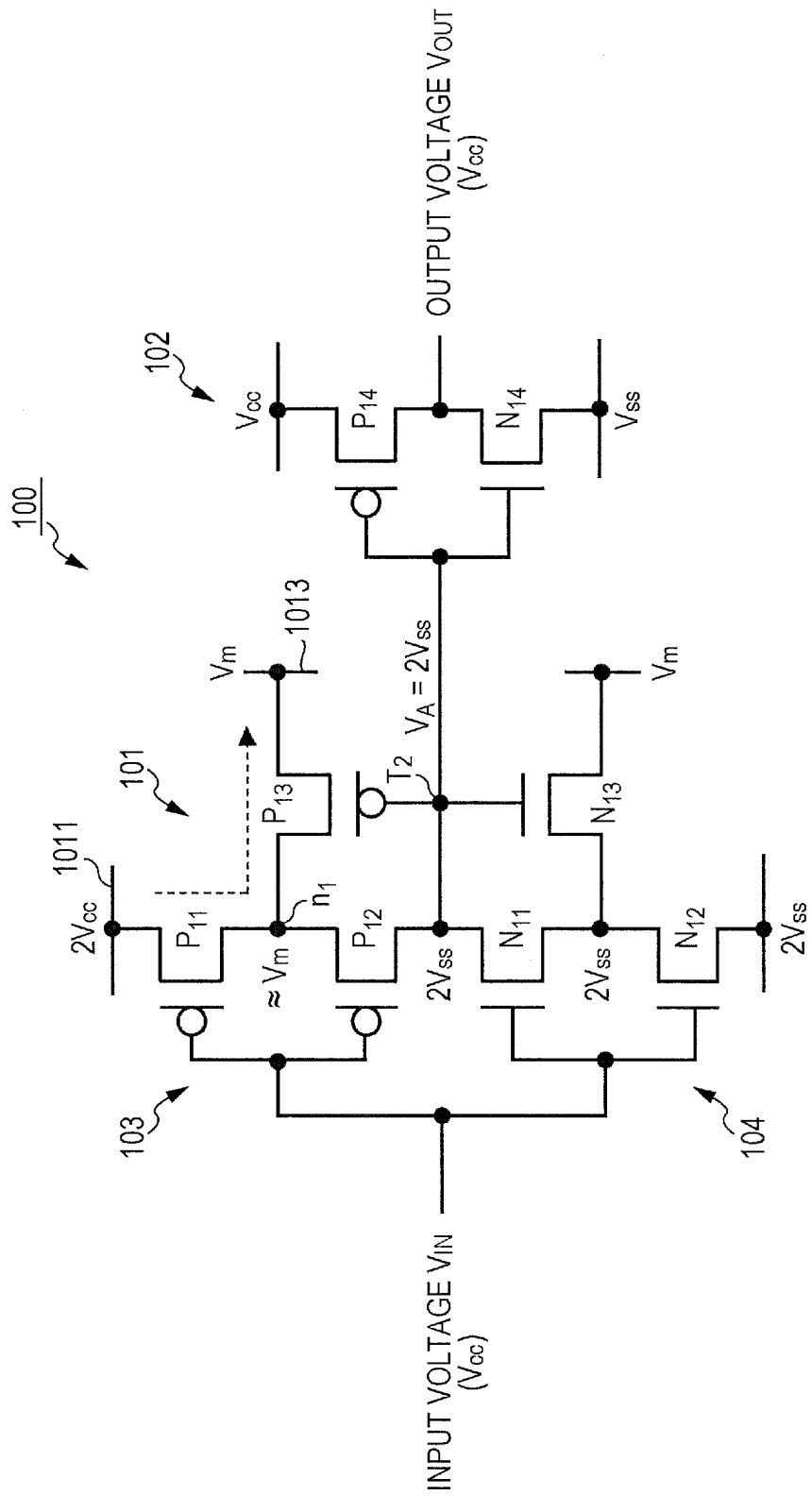
FIG. 3 is a diagram illustrating diagram provided for explanation of the circuit operation of a case where input voltage $V_{IN}$ is low level $V_{cc}$.
Figure 4:
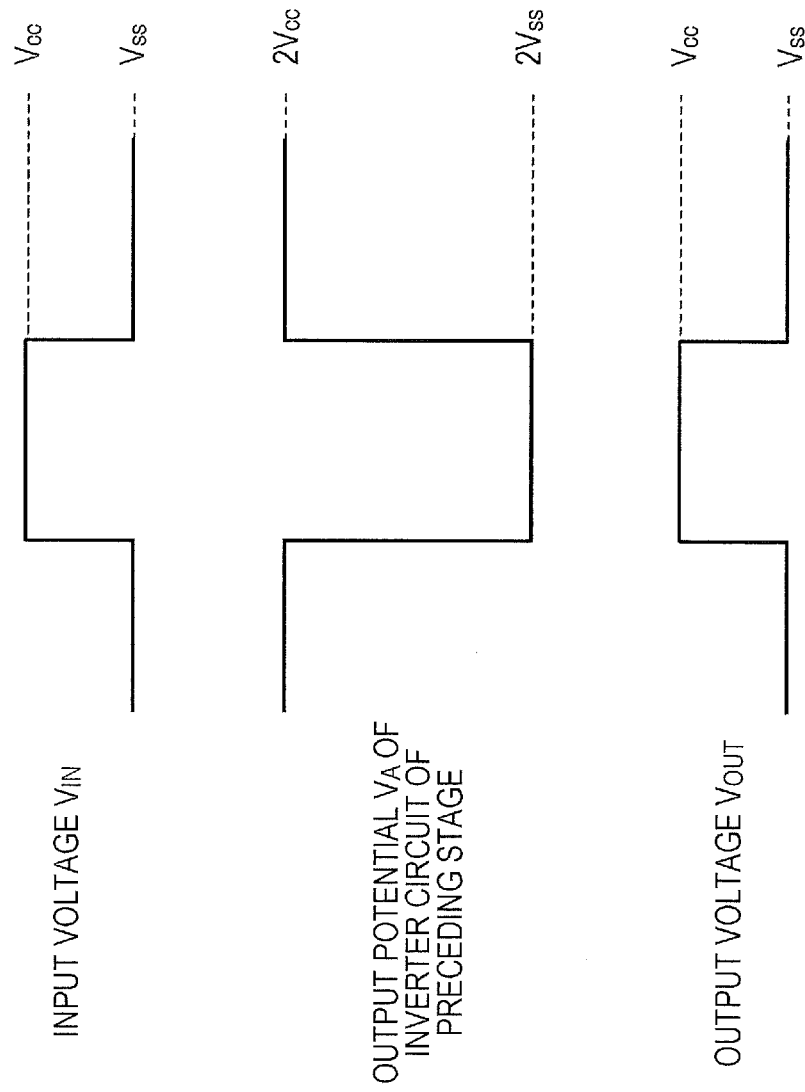
FIG. 4 is a waveform diagram illustrating each waveform of input voltage $V_{IN}$ of the buffer circuit, electric potential $V_A$ of output terminal $T_3$ of the inverter circuit of the pre-stage, and the output voltage $V_{OUT}$ of this buffer circuit.

Then, circuit operation of case where input voltage $V_{IN}$ is higher voltage (high level) $V_{cc}$ will be disclosed using an operation illustration diagram of FIG. 3.

When input voltage $V_{IN}$ is high-level $V_{cc}$, the N channel double gate transistors $N_{11}$ and $N_{12}$ of the second transistor circuit 104 and P channel transistor $P_{11}$ of the positive power supply side of first transistor circuit 103 become the conduction state. Thereupon, electric potential $V_A$ of the output terminal $T_2$ of the inverter circuit 101 of the pre-stage decreases.

Then, P channel transistor P11 becomes the conduction state when electric potential $V_A$ of the output terminal $T_2$ of the inverter circuit 101 of the pre-stage is equal to or lower than (the voltage $V_m$ of the third fixed power supply 1013+a threshold voltage of P channel transistor $P_{11}$). In this way, as shown with the arrow of the dashed line in FIG. 3, the penetration current flows through the path of the first fixed power supply 1011→P channel transistor $P_{11}$→P channel transistor $P_{13}$→the third fixed power supply 1013.

Here, the electric potential of the common connection node $n_1$ of the double gate transistors $P_{11}$ and $P_{12}$ of the first transistor circuit 103 can approximately assume voltage $V_m$ of the third fixed power supply 1013 by the voltage between the each gate and source of P channel transistors $P_{11}$ and $P_{13}$ and the size. At this time, the voltage between the source and drain of each of transistors $P_{11}$, $P_{12}$ and $P_{13}$ of the first transistor circuit 103 side becomes ($V_{cc}$-$V_s$) at the maximum. Accordingly, the voltage between the source and drain of transistors $P_{11}$, $P_{12}$ and $P_{13}$ does not exceed the source-drain breakdown voltage ($V_{cc}$-$V_{ss}$) of these transistors $P_{11}$, $P_{12}$ and $P_{13}$.

[2-3. Operation and Effect of an Embodiment]

In buffer circuit 100 which is made by disposing at least one stage of the inverter circuit 101 in front of the inverter circuit 102 of the final stage, at first, a configuration that sets the power supply voltages (2 $V_{cc}$, 2 $V_{ss}$) to be given in the inverter circuit 101 of the pre-stage to be more greatly than input voltage $V_{IN}$ is adopted. In this way, the voltage between the gate and the source of these transistors $P_{14}$ and $N_{14}$ can be raised by lowering the resistance of the inverter circuit 102 of the final stage, without raising the size of transistors $P_{14}$ and $P_{14}$ constituting the inverter circuit 102, in other words, the amplitude of the input voltage of the inverter circuit 102 of the final stage can be increased.

Then, such a configuration that the first and the second transistor circuits 103 and 104 are constituted by a double gate transistors, and while one transistor circuit 103/104 operates, is given the common connection node $n_2$/$n_1$ of the double gate transistors of the other transistor circuits 104/103 voltage $V_m$ of the third fixed power supply 1013 is adopted. In this way, the voltage between the gate and the source of each of the transistors $P_{14}$ and $N_{14}$ which constitute the inverter circuit 102 can be raised with the source-drain breakdown voltage of each transistor constituting the first and the second transistor circuits 103 and 104 maintained, in other words, the amplitude of the input voltage of the inverter circuit 102 of the final stage can be increased.

In this case, the amplitude of a waveform input into the inverter circuit 102 of the final stage becomes (2 $V_{cc}$-2 $V_{ss}$), and between the gate and the source of each of transistors $P_{14}$ and $N_{14}$ constituting the inverter circuit 102 of the final stage, the voltage which exceeds the source-drain breakdown voltage ($V_{cc}$-$V_{ss}$) will be taken. However, generally, the gate-source breakdown voltage of the transistor is greater than the source-drain breakdown voltage (high). Accordingly, between the gate and source of each of transistors $P_{14}$ and $N_{14}$, the voltage which exceeds the source-drain breakdown voltage can be applied. Then, the voltage between the gate and the source of transistor $P_{14}$ and $N_{14}$ is raised, in other words, the resistance of the inverter circuit 102 can be lowered by increasing the amplitude of the input voltage of the inverter circuit 102 of the final stage.

As disclosed above, the amplitude of the voltage input into the inverter circuit 102 of the final stage can be increased with the source-drain breakdown voltage of each transistor constituting buffer circuit 100 maintained in the buffer circuit 100 according to the present embodiment. Again, it is possible to reduce the size of each of transistors $P_{14}$ and $N_{14}$ which are included in the inverter 102 by increasing the amplitude of the input voltage of the inverter circuit 102 of the final stage.

Figure 5:
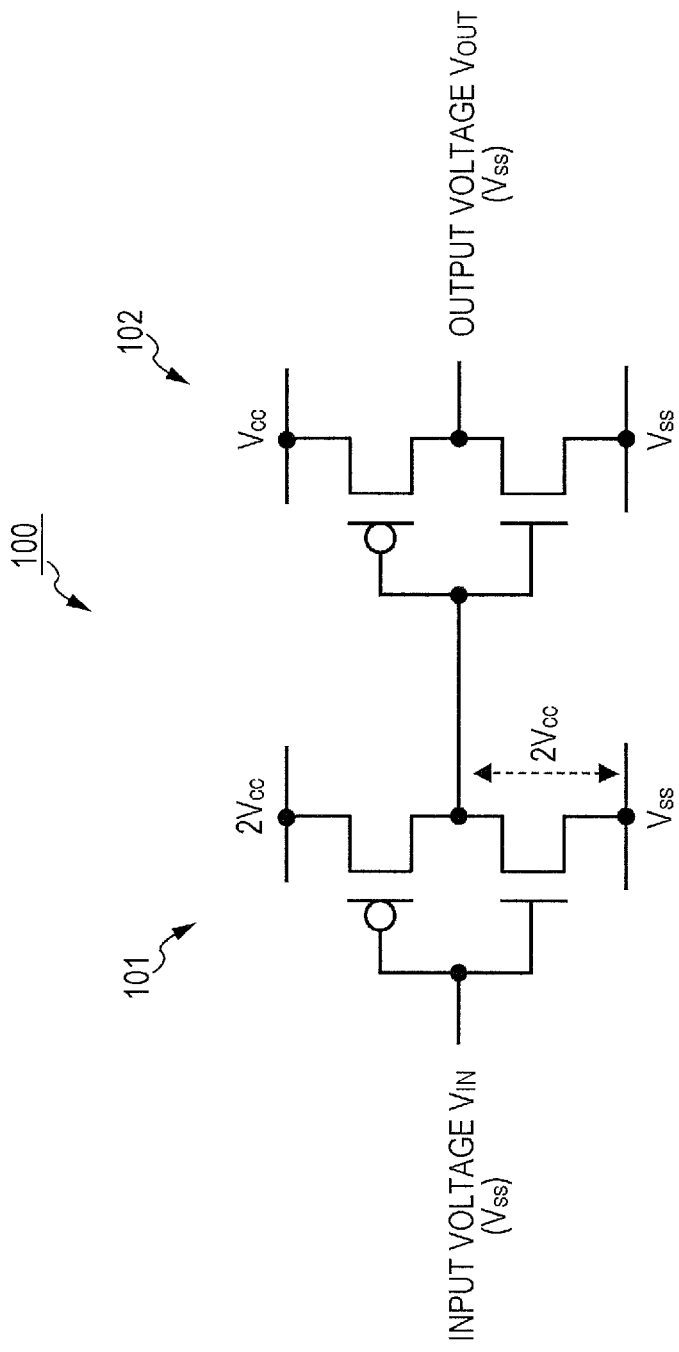
FIG. 5 is a circuit diagram illustrating a case where the inverter circuit of the pre-stage include a single gate transistor same as the inverter circuit of the last stage.

Here, as shown in FIG. 5, a buffer circuit is considered to have a constitution using the transistor of the single gate with respect to the inverter circuit 101 of the pre-stage similarly to the inverter circuit 102 of the final stage. In this buffer circuit, merely, when the power supply voltage to be given in the inverter circuit 101 of the pre-stage is increased greater than input voltage $V_{IN}$, the voltage between a source and drain of a transistor constituting the inverter circuit 101 of the pre-stage becomes large and exceeds a predetermined source-drain breakdown voltage. In the case of this example too, the source-drain breakdown voltage assumes ($V_{cc}$-$V_{ss}$).

In the above, the buffer circuit 100 according to the desirable embodiment is disclosed where the first and the second transistor circuits 103 and 104 each includes double gate transistors together, but the technique of the present disclosure is not limited to the buffer circuit 100 according to the desirable embodiment. In other words, at least one transistor circuit of the first and the second transistor circuit 103 and 104 can be constituted to include double gate transistors.

The buffer circuit 100 according to the present embodiment can be used for various kinds of uses as a general buffer circuit, and, for example, in a scanning circuit outputting a scanning signal which scans pixels disposed in a matrix form, it is possible to use as a buffer circuit of the output terminal. In addition, the scanning circuit (scanning circuit of the present disclosure) which uses the buffer circuit 100 according to the present embodiment for an output stage can be used as a scanning circuit which scans each pixel, in the display device disposed in a in a matrix form and including an electro-optic element, or in a solid imaging device in which the pixels each including the photoelectric conversion element are disposed in a matrix form.

In the following, a display device equipped with the scanning circuit which uses the buffer circuit 100 according to the present embodiment for an output stage will be described as a display device of the present disclosure.

<3. Display Device>

[3-1. System Configuration]

Figure 6:
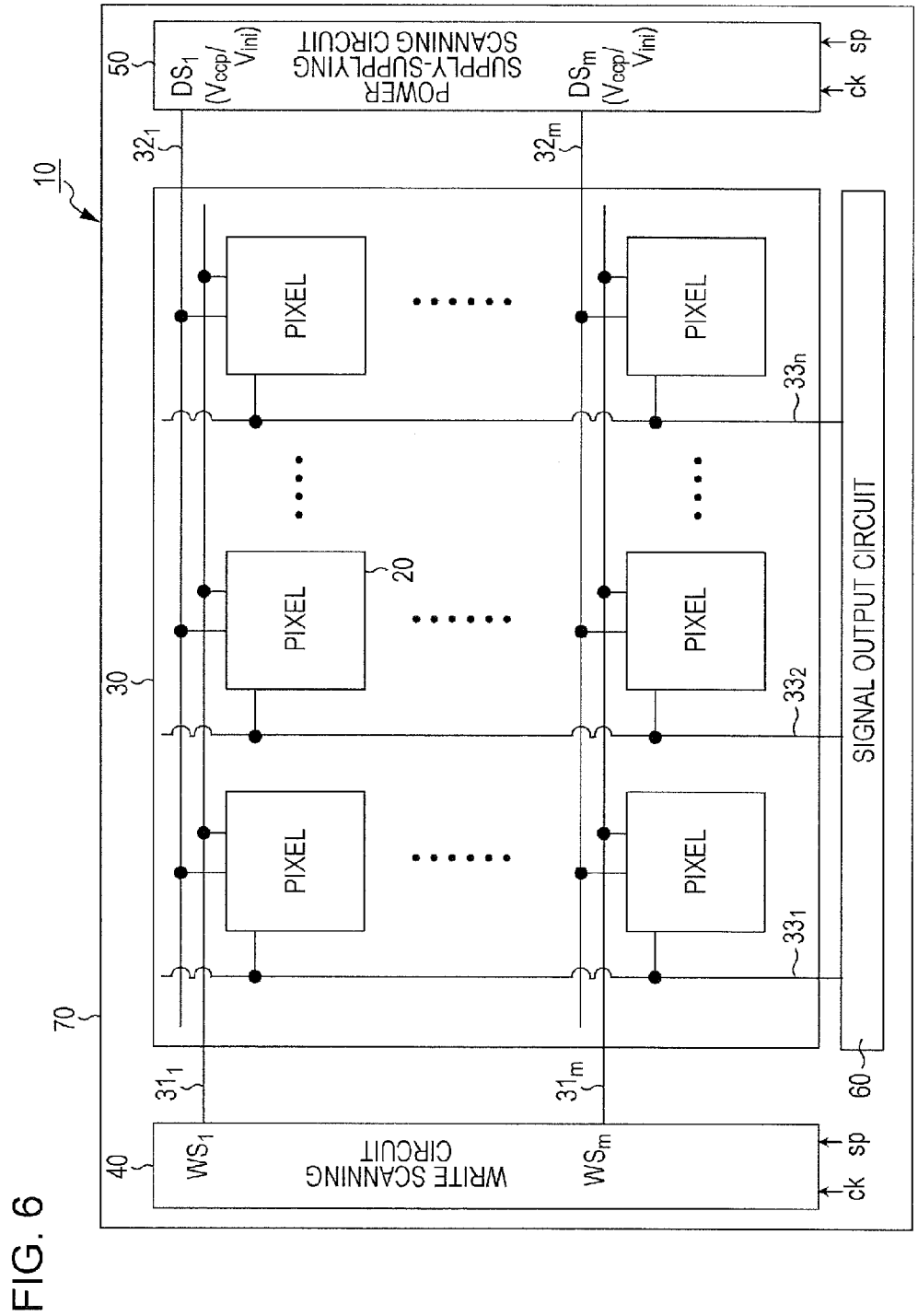
FIG. 6 is a configuration diagram illustrating an outline of a configuration of the organic EL display device of the present disclosure.

FIG. 6 is a display device of the present disclosure, for example, a system configuration diagram illustrating the outline of the constitution of the active matrix type display device.

The active matrix type display device is a display device which controls the current flowing in an electro-optic element by the active element installed within a pixel same as the electro-optic element, for example, by an insulated-gate field effect transistor. As for an insulated-gate field effect transistor, typically, a TFT (Thin Film Transistor) is used.

Here, as an example, a case of the active matrix type organic EL display device that the current driven type electro-optic element that the light emission luminance changes depending on a value of current flowing in the device, for example, an organic EL element is used for a light emitting element of the pixels (pixel circuit) will be described as an example.

As shown in FIG. 6, the organic EL display device 10 according to an example has a configuration including a pixel array section 30 in which plural pixels 20 each including the organic EL element are disposed in a two dimensional matrix form, and a drive circuit section that is disposed around the pixel array section 30. The drive circuit section includes a write scanning circuit 40, a power supplying scanning circuit 50, a signal output circuit 60 and the like, and drives each pixel 20 of the pixel array section 30.

Here, when the organic EL display device 10, one pixel (unit pixel) that is a unit to form a color image includes plural sub-pixels, each sub-pixel is equivalent to the pixel 20 of FIG. 6. More specifically, with the display device corresponding to color display, one pixel includes three sub-pixels, for example, a sub-pixel for emitting a red light (R), a sub-pixel for emitting a green light (G), and a sub-pixel for emitting a blue light (B).

But, the one pixel is not limited to the combination of sub-pixels of 3 primary colors of RGB, but one color or a plural colored sub-pixel may be further added to the sub-pixel of 3 primary colors to constitute one pixel. More specifically, for example, in order to improve the luminance, a sub-pixel to emit white (W) light is added to constitute one pixel, and in order to enlarge a color reproduction range, at least one of sub-pixel to emit complementary color light is added, thereby one pixel can be constituted.

To the pixel array section 30, for arrangement of the pixels 20 of m rows n columns, the scanning lines $31_1$ to $31_m$ and the power supplying line $32_1$ to $32_m$ along row direction (direction along the pixel row/arrangement direction of pixel of the pixel row) are wired every pixel row. Furthermore, for arrangement the pixels 20 of m rows n columns, a signal line $33_1$ to $33_n$ along a column direction (direction along the pixel column/arrangement direction of pixel of the pixel column) is wired every pixel column.

The scanning lines $31_1$ to $31_m$ are connected to the output terminals of the corresponding rows of the write scanning circuit 40 respectively. The power supplying lines $32_1$ to $32_m$ are connected to the output terminals of the corresponding row of power supplying scanning circuit 50 respectively. Signal lines $33_1$ to $33_m$ are connected to the output terminals of the corresponding columns of the signal output circuit 60 respectively.

The pixel array section 30 is usually formed on a transparent insulation board such as a glass substrate. In this way, the organic EL display device 10 has a panel structure of the plane-type (flat type). The drive circuit of each the pixel 20 of the pixel array section 30 can form using an amorphous silicon TFT or a low temperature poly-silicon TFT.

The write scanning circuit 40 is constructed by shift register circuits which perform a shift (transfer) of a start pulse sp sequentially in sync with a clock pulse ck. The write scanning circuit 40 performs scanning (line-sequential scanning) of each of the pixels 20 of the pixel array section 30 by a row unit in turn, on the occasion of writing the signal voltage of the video signal to each the pixel 20 of the pixel array section 30, by supplying the write scanning signal WS ($WS_1$ to $WS_m$) for the scanning line 31 ($31_1$ to $31_m$).

The power supplying scanning circuit 50 is constructed by shift register circuits shifting start pulse sp sequentially in sync with a clock pulse ck and the like. This power supplying scanning circuit 50 supplies the power supply electric potential DS ($DS_1$ to $DS_m$) where can be switched by the second power supply electric potential $V_{ini}$ which is lower than the first power supply electric potential $V_{ccp}$ and the first power supply electric potential $V_{ccp}$ to the power supplying line 32 ($32_1$ to $32_m$) in sync with the line-sequential scanning by the write scanning circuit 40. By the switching of $V_{ccp}/V_{ini}$ of the power supply electric potential DS, control of the light emission/non-light emission of the pixel 20 is performed.

The signal output circuit 60 outputs the signal voltage (hereinafter, there is a case of referring to simply "signal voltage") $V_{sig}$ the video signal depending on luminance information which is supplied from a signal supply source (not shown) and a reference voltage $V_{ofs}$ selectively. Here, the reference voltage $V_{ofs}$ is an electric potential that becomes the reference of the signal voltage $V_{sig}$ of the video signal (for example, electric potential corresponding to the black level of the video signal).

The signal voltage $V_{sig}$/the reference voltage $V_{ofs}$ which is output from the signal output circuit 60 is written in the unit of the pixel row selected by scanning by the write scanning circuit 40 for each pixel 20 of the pixel array section 30 through a signal line 33 ($33_1$ to $33_n$). In other words, the signal output circuit 60 adopts the drive form of the line-sequence writing which writes the signal voltage $V_{sig}$ in a row unit.

[3-2. Pixel Circuit]

Figure 7:
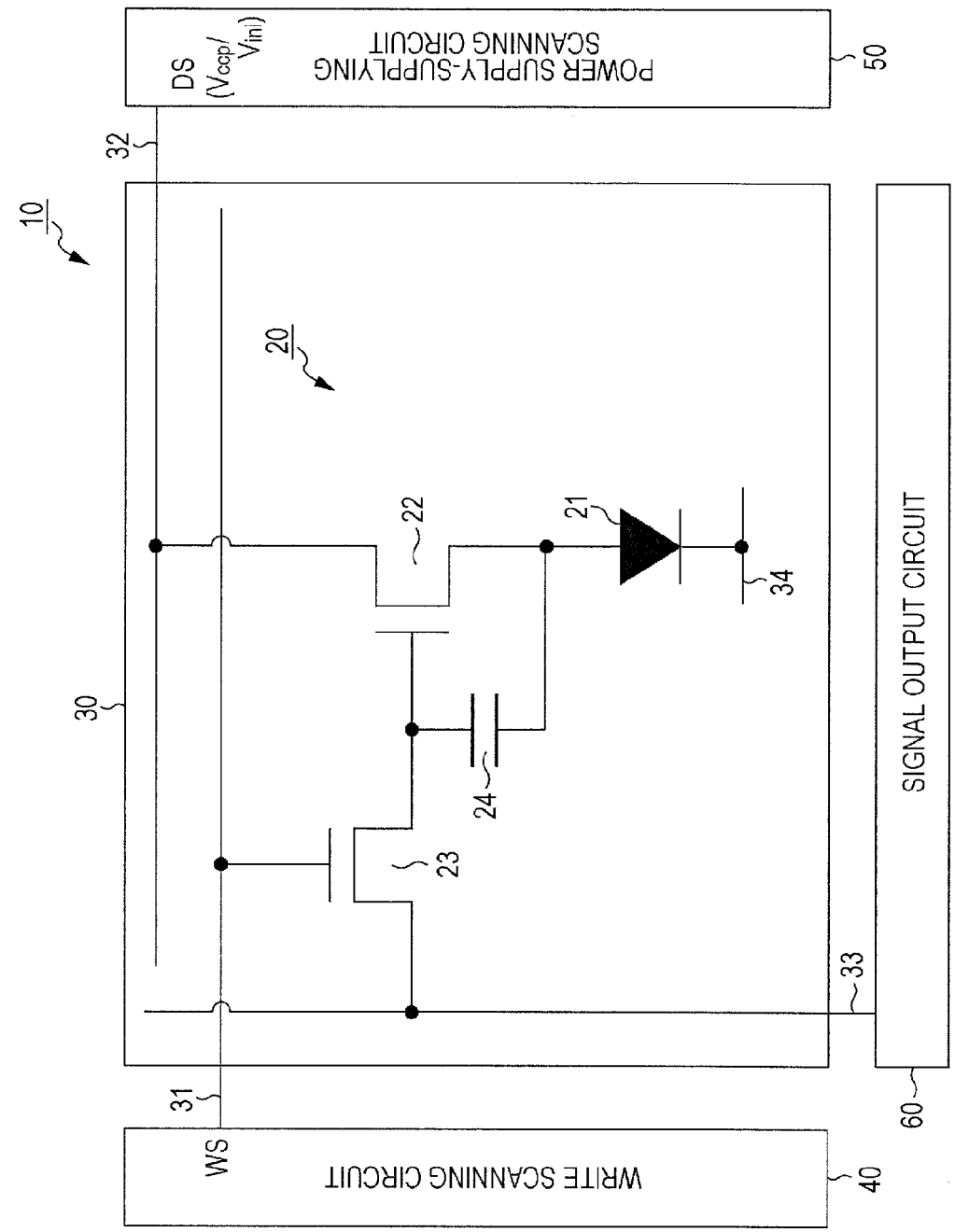
FIG. 7 is a circuit diagram illustrating an example of the detailed circuit configuration of the pixel (pixel circuit)

FIG. 7 is a circuit diagram illustrating an example of a detailed circuit configuration of pixel (pixel circuit) 20. The light emitting section of the pixel 20 is formed from the organic EL element 21 which is the current driven type electro-optic element that light emission luminance changes depending on value of a current flowing in a device.

As shown in FIG. 7, the pixel 20 is constructed by an organic EL element 21 and the drive circuit which drives the organic EL element 21 by flowing current to the organic EL element 21. The organic EL element 21 is made such that a cathode electrode is connected to the common power supplying line 34 that wiring (so-called, solid wiring) is performed in common with respect to all pixels 20.

The drive circuit which drives the organic EL element 21 is constituted to have a drive transistor 22, a write transistor 23 and a storage capacitor 24. The TFT of the N channel type can be used for the drive transistor 22 and the write transistor 23. The combination of conductive types of the drive transistor 22 and the write transistor 23 as shown in the drawing is only an example, but is not limited to the combination.

As for the drive transistor 22, one electrode (source/drain electrode) is connected to an anode electrode of the organic EL element 21, and the other electrode (source/drain electrode) is connected to the power supplying line 32 ($32_1$ to $32_m$).

As for the write transistor 23, one electrode (source/drain electrode) is connected to signal line 33 ($33_1$ to $33_n$), and the other electrode (source/drain electrode) is connected to a gate electrode of the drive transistor 22. In addition, the gate electrode of the write transistor 23 is connected to the scanning line 31 ($31_1$ to $31_m$).

In the drive transistor 22 and the write transistor 23, so-called one electrode indicates a metal wiring connected to the source/drain region electrically and the other electrode indicates a metal wiring connected to the drain/source region electrically. In addition, if the one electrode becomes the source electrode by the electric potential relations between the one electrode and the other electrode, the other electrode also becomes the drain electrode, and if the other electrode becomes the drain electrode, the one electrode also becomes the source electrode.

The storage capacitor 24 is made such that one electrode is connected to a gate electrode of the drive transistor 22, and the other electrode is connected to the other electrode of the drive transistor 22 and the anode electrode of the organic EL element 21.

In the pixel 20 of the constitution mentioned above, the write transistor 23 becomes the conduction state in response to High active of the write scanning signal WS applied to a gate electrode through the scanning line 31 from the write scanning circuit 40. In this way, the write transistor 23 samples the signal voltage $V_{sig}$ of the video signal depending on the luminance information or the reference voltage $V_{ofs}$ which is supplied from the signal output circuit 60 through a signal line 33 and writes in the pixel 20. The signal voltage $V_{sig}$ or the reference voltage $V_{ofs}$ written by the write transistor 23 is applied to a gate electrode of the drive transistor 22 and is retained to the storage capacitor 24.

In the drive transistor 22, when the power supply electric potential DS of the power supplying line 32 ($32_1$ to $32_m$) is in the first power supply electric potential $V_{ccp}$, one electrode becomes a drain electrode and the other electrode becomes the source electrode, and works in a saturated region. In this way, the drive transistor 22 receives the supply of the current from the power supplying line 32 and drives the organic EL element 21 by current drive. More specifically, the drive transistor 22 supplies the driving current of the current value depending on voltage value of the signal voltage $V_{sig}$ held to the storage capacitor 24 to the organic EL element 21 by working in a saturated region and the organic EL element 21 is driven by current to emit light.

The drive transistor 22 is furthermore made such that when the power supply electric potential DS was changed from the first power supply electric potential $V_{ccp}$ to the second power supply electric potential $V_{ini}$, one electrode becomes the source electrode, the other electrode becomes the drain electrode, and it operates as a switching transistor. In this way, the drive transistor 22 stops the supply of the driving current to the organic EL element 21 and makes the organic EL element 21 a non-light emission state. In other words, the drive transistor 22 has both functions as a transistor controlling the light emission/non-light emission of the organic EL element 21.

By switching the operation of the drive transistor 22, the organic EL element 21 establishes (non-light emission period) a period when the organic electroluminescence element 21 becomes the non-light emission state and can control the ratio (duty) of the light emission period and the non-light emission period of the organic EL element 21. By the duty control, for every one display frame period, since a pixel can reduce the residual image blur with emitting light, particularly, the quality of video image can be improved.

Among the first and the second power supply electric potentials $V_{ccp}$ and $V_{ini}$ supplied selectively through the power supplying line 32 from the power supplying scanning circuit 50, the first power supply electric potential $V_{ccp}$ is the power supply electric potential to supply the driving current that drives the organic EL element 21 to the drive transistor 22. In addition, the second power supply electric potential $V_{ini}$ is the power supply electric potential to take a reverse bias for the organic EL element 21. The second the power supply electric potential $V_{ini}$ is set to the electric potential that is lower than the reference voltage $V_{ofs}$, for example, the electric potential that is lower than $V_{ofs}$-$V_{th}$ when assuming the threshold voltage $V_{th}$ of the drive transistor 22, preferably, the electric potential lower enough than $V_{ofs}$-$V_{th}$.

[3-3. Scanning Circuit]

In the organic EL display device 10 which is disclosed as mentioned above, as a buffer circuit constituting an output stage of the writing scanning circuit 40 or the power supplying scanning circuit 50 which are peripheral circuits of the pixel array section 30, the buffer circuit 100 according to the embodiment mentioned above can be used.

Here, a case of using the buffer circuit 100 according to the embodiment mentioned above as for a buffer circuit constituting an output stage of the write scanning circuit 40 will be disclosed as an example.

Figure 8:
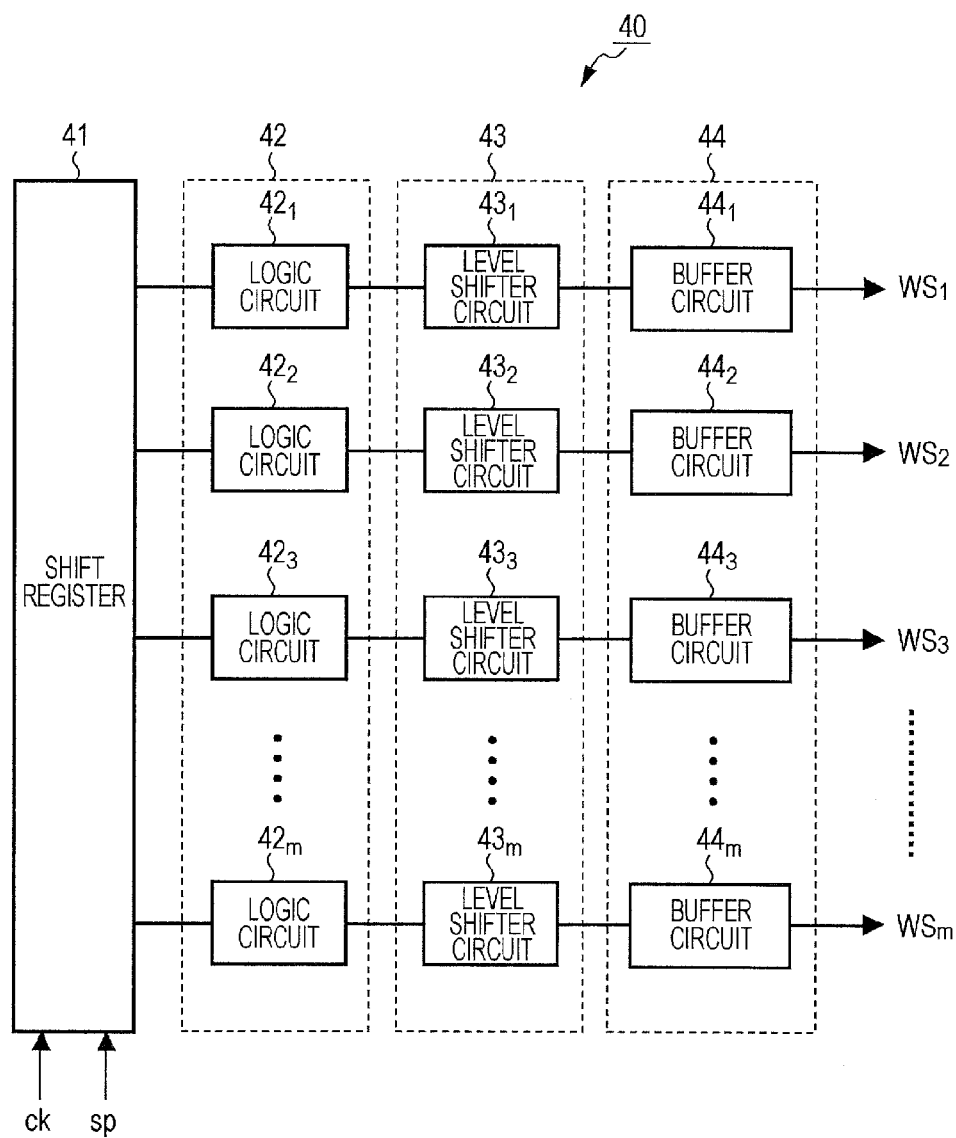
FIG. 8 is a block diagram illustrating an example of a configuration of the write scanning circuit.

FIG. 8 is a block diagram illustrating an example of the configuration of the write scanning circuit 40.

As shown in FIG. 8, the write scanning circuit 40, for example, is constructed by a shift register circuit 41, a logic circuit group 42, a level shifter circuit group 43, and a buffer circuit group 44 of the output stage. The shift register circuit 41 is constituted such that shift stages (transfer stage/unit circuit) of the number of stages corresponding to the number m of row of the pixel array section 30 are connected in cascade, a start pulse sp shifts in order in sync with clock pulse ck and a shift pulse is output sequentially from each shift stage.

Each of the logic circuit group 42, the level shifter circuit group 43 and the buffer circuit group 44 includes logic circuits $42_1$ to $42_m$ of the number corresponding to the number m of row of the pixel array section 30, level shifter circuits $43_1$ to $43_m$, and buffer circuits $44_1$ to $44_m$.

Each of logic circuits $42_1$ to $42_m$ of the logic circuit group 42 timing-adjusts a shift pulse that is output from the corresponding shift stage of the shift register circuit 41 in the scanning pulse of a predetermined timing. Each of level shifter circuits $43_1$ to $43_m$ of level shifter circuit group 43 level-shifts (level-converts) the scanning pulse of the logic level, in the scanning pulse of the level that is higher than the scanning pulse of the logic level. Each of buffer circuits $44_1$ to $44_m$ of the buffer circuit group 44 supplies the scanning pulse after the level shift to the scanning lines $31_1$ to $31_m$ of the pixel array section 30 as write scanning signals (pulse) $WS_1$ to $WS_m$.

In the write scanning circuit 40 of the constitution mentioned above, the buffer circuit 100 according to the embodiment mentioned above can be used for each of buffer circuits $44_1$ to $44_m$ of the buffer circuit group 44 constituting the output stage. In a state that this buffer circuit 100 is maintaining the source-drain breakdown voltage of each transistor constituting the buffer circuit 100 as mentioned before, it is possible to increase the amplitude of the voltage which is input into the inverter circuit 102 of the final stage.

Then, by raising the voltage between the gate and the source of transistors $P_{14}$ and $N_{14}$ which constitute the inverter circuit 102 of the final stage and lowering resistance (i.e., on resistance of transistors $P_{14}$ and $N_{14}$) of the inverter circuit 102 of the final stage, upsizing of a display panel 70 is enabled. More specifically, load of the scanning lines $31_1$ to $31_m$ becomes large by upsizing of the display panel 70, and though it is in the circumstances that waveform of write scanning pulses $WS_1$ to $WS_m$ becomes dull due to the influence of the load, since the resistance of the inverter circuit 102 of the final stage decreases, thereby being able to minimize the influence of the load. Accordingly, upsizing of the display panel 70 is enabled.

In addition, by increasing the amplitude of the input voltage of the inverter circuit 102 of the final stage, it is possible to perform the downsizing of transistors $P_{14}$, $N_{14}$ constituting inverter 102. In this way, the downsizing of a circuit scale of the buffer circuit 100 is enable to realize the downsizing of a circuit scale of the write scanning circuit 40 and the power supplying scanning circuit 50, which have the number of rows of pixel row of the pixel array section 30 in buffer circuit 100.

As a result, in the organic EL display device such that the write scanning circuit 40 and the power supplying scanning circuit 50, for example, as shown in FIG. 6 are mounted on the display panel 70 same as the pixel array section 30, thereby being able to perform the narrowing of the frame of the display panel 70. In addition, when the organic EL display device is made adopting such a configuration that the write scanning circuit 40 and the power supplying scanning circuit 50 are disposed outside the display panel 70 as a driver IC, whereby being able to realize the downsizing of the driver IC.

[3-4. Others]

With the organic EL display device mentioned above, for example, a case of a constitution where the pixel 20 includes two N channel transistors 22 and 23 and one storage capacitor 24 is proposed and described. However, the pixel 20 is not limited to this circuit configuration. In other words, for example, it may be the pixel 20 of a circuit configuration using the TFT of the P channel type as the drive transistor 22 or a circuit configuration having an auxiliary capacity which compensates the capacity deficit of the organic EL element 21 and raises the writing gain of the video signal for storage capacitor 24. Further, it may be the pixel 20 of a circuit configuration having switching transistors separately to write in the reference voltage $V_{ofs}$ and the second power supply electric potential $V_{ini}$ selectively.

In addition, in the case of the application example mentioned above, as an electro-optic element of the pixel 20, for example, the case that is adapted to the organic EL display device using the organic EL element is proposed and described as an example. However, the technique of the present disclosure is not limited to this application example. Specifically, the technique of the present disclosure is applicable for a display device, as a whole that has the scanning circuit, such as a liquid crystal display device and the plasma display device, other than the display device using the current driven-type electro-optic element (light emitting element) in which light emission luminance changes depending on a current value flowing to the device such as an inorganic EL element, an LED element and a semiconductor laser element. Further, it is not limited only to a display device, but it is applicable for a device as a whole having the scanning circuit, such as the solid imaging device.

<4. Electronic Equipment>

The display device which is equipped with the scanning circuit which uses a buffer circuit of the present disclosure as mentioned above, for an output stage, can use the video signal input into the electronic equipment, or the video signal that is produced in electronic equipment, as an display section (display device) of the electronic equipment of every field to display as an image or a video.

As is apparent from the disclosure of the embodiment mentioned above, the scanning circuit which uses a buffer circuit of the present disclosure for an output stage, and for example, in accordance with a display device mounted on the display panel as the same as the pixel array section, the narrowing of the frame of the display panel can be realized. Accordingly, in the electronic equipment of every field having a display section, the downsizing of the electronic equipment main body by using a display device equipped with the scanning circuit which uses a buffer circuit of the present disclosure for an output stage, as the display section can be realized.

As for this electronic equipment, for example, a PDA (Personal Digital Assistant), a game machine, a notebook type personal computer, mobile information appliances such as electronic books and a mobile communication equipment such as a cellular telephone and the like, the other than a television set, a digital camera, a video camera and the like, can be exemplified.

<5. Constitution of the Present Disclosure>

In addition, the present disclosure can adopt the following constitution.

(1) A buffer circuit includes a first transistor circuit having a first conductive type transistor, a second transistor circuit having a second conductive type transistors, wherein the first and second transistor circuits are serially connected between a first fixed power supply and a second fixed power supply, and input terminals and output terminals of each of the first and second transistor circuits are connected in common respectively, wherein at least one transistor circuit of the first transistor circuit and the second transistor circuit is a double gate transistor, and wherein a switch element, when any one transistor circuit of the first and the second transistor circuits is in an operating state, is included to supply a voltage of a third fixed power supply to a common connection node of the double gate transistor of the other transistor circuit.

(2) The buffer circuit disclosed above, wherein a voltage between the first fixed power supply and the third fixed power supply, and a voltage between the third fixed power supply and the second fixed power supply are voltages within a range of a source-drain breakdown voltage of each of the transistors which is included in the first and the second transistor circuits.

(3) The buffer circuit disclosed above, wherein a voltage of the third fixed power supply is a value between the voltages of the first fixed power supply and the second fixed power supply.

(4) The buffer circuit disclosed above, wherein the voltage of the third fixed power supply is an average value of the voltages of the first fixed power supply and the second fixed power supply.

(5) The buffer circuit disclosed above, wherein a voltage of the first fixed power supply is higher than a voltage of a higher voltage side of input voltages applied to the input terminal, and a voltage of the second fixed power supply is lower than a voltage of a lower voltage side of the input voltages.

(6) The buffer disclosed above, wherein the switch element is a transistor having the same conductive type as the other transistor circuit which forms an inverter circuit.

(7) The buffer circuit disclosed above, wherein the transistor of the same conductive type has a gate electrode being connected to an output terminal.

(8) The buffer circuit disclosed above, wherein the first transistor circuit includes a first and a second P channel transistors of double gate structure which are connected to the input terminal and the gate electrodes thereof being connected in common, the first P channel transistor has a source electrode being connected to the first fixed power supply, the second P channel transistor has a drain electrode being connected to the output terminal, and a drain electrode of the first P channel transistor and a source electrode of the second P channel transistor are connected to each other in common to be a common connection node, and the voltage of the third fixed power supply is supplied to the common connection node by the switch element.

(9) The buffer circuit disclosed above, wherein the second transistor circuit includes the first and second N channel transistors of double gate structure which are connected to the input terminal, and the gate electrodes thereof being connected in common, the first N channel transistor has a drain electrode being connected to the output terminal, the second N channel transistor has a source electrode being connected to the second fixed power supply, a source electrode of the first N channel transistor and a drain electrode of the second N channel transistor are connected to each other in common to be the common connection node, and the voltage of the third fixed power supply is supplied to the common connection node by the switch element.

(10) A buffer circuit disclosed above, wherein the output terminal is connected to an inverter circuit of a final stage.

(11) A buffer circuit disclosed above, wherein a voltage of the first fixed power supply is higher than a voltage of a positive side power supply of the inverter circuit of the final stage, and a voltage of the second fixed power supply is lower than a voltage of a negative side power supply of the inverter circuit of the final stage.

(12) A scanning circuit including a buffer circuit that outputs a scanning signal to scan pixels disposed in a in a matrix form in an output stage, wherein the buffer circuit, includes a first transistor circuit having a first conductive type transistors, a second transistor circuit having a second conductive type transistors, wherein the first and second transistor circuits are serially connected between a first fixed power supply and a second fixed power supply, and input terminals and output terminals of each of the first and second transistor circuits are connected in common respectively, wherein at least one transistor circuit of the first transistor circuit and the second transistor circuit is a double gate transistor, and wherein a switch element, when any one transistor circuit of the first and the second transistor circuits is in an operating state, is included to supply a voltage of a third fixed power supply to a common connection node of the double gate transistor of the other transistor circuit.

(13) A display device including, a pixel array section in which pixels each including an electro-optic element are disposed in a in a matrix form, and a scanning circuit that scans each pixel of the pixel array section and has a buffer circuit in an output stage, wherein the buffer circuit includes a first transistor circuit having a first conductive type transistors, a second transistor circuit having a second conductive type transistors, wherein the first and second transistor circuits are serially connected between a first fixed power supply and a second fixed power supply, and input terminals and output terminals of each of the first and second transistor circuits are connected in common respectively, wherein at least one transistor circuit of the first transistor circuit and the second transistor circuit is a double gate transistor, and wherein a switch element, when any one transistor circuit of the first and the second transistor circuits is in an operating state, is included to supply a voltage of a third fixed power supply to a common connection node of the double gate transistor of the other transistor circuit.

(14) An electronic equipment having a display device including, a pixel array section in which pixels each including an electro-optic element are disposed in a matrix form, and a scanning circuit which scans each pixel of the pixel array section and has a buffer circuit in an output stage, wherein the buffer circuit includes a first transistor circuit having a first conductive type transistors, a second transistor circuit having a second conductive type transistors, wherein the first and second transistor circuits are serially connected between a first fixed power supply and a second fixed power supply, and input terminals and output terminals of each of the first and second transistor circuits are connected in common respectively, wherein at least one transistor circuit of the first transistor circuit and the second transistor circuit is a double gate transistor, and wherein a switch element, when any one transistor circuit of the first and the second transistor circuits is in an operating state, is included to supply a voltage of a third fixed power supply to a common connection node of the double gate transistor of the other transistor circuit.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:
   a pixel array section including a plurality of pixels respectively including an electro-optic element; and
   a scanning circuit that scans the plurality of pixels and has a buffer circuit in an output stage,
   wherein the buffer circuit includes a first transistor circuit and a second transistor circuit,
   wherein the first and second transistor circuits are serially connected between a first fixed power supply and a second fixed power supply, and input terminals and output terminals of each of the first and second transistor circuits are connected in common respectively,
   wherein at least one transistor circuit of the first transistor circuit and the second transistor circuit is a double gate transistor, and
   wherein a switch element, when any one transistor circuit of the first and the second transistor circuits is in an operating state, is comprised to supply a voltage of a third fixed power supply to a common connection node of the double gate transistor of the other transistor circuit.

2. The display device according to claim 1, wherein a voltage between the first fixed power supply and the third fixed power supply, and a voltage between the third fixed power supply and the second fixed power supply are voltages within a range of a source-drain breakdown voltage of each of the transistors which is included in the first and the second transistor circuits.

3. The display device according to claim 1, wherein a voltage of the third fixed power supply is a value between the voltages of the first fixed power supply and the second fixed power supply.

4. The display device according to claim 3, wherein a voltage of the third fixed power supply is an average value of the voltages of the first fixed power supply and the second fixed power supply.

5. The display device according to claim 1, wherein a voltage of the first fixed power supply is higher than a voltage of a higher voltage side of input voltages applied to the input terminal, and a voltage of the second fixed power supply is lower than a voltage of a lower voltage side of the input voltages.

6. The display device according to claim 1, wherein the switch element is a transistor having the same conductive type as another transistor circuit which forms an inverter circuit.

7. The display device according to claim 6, wherein the transistor of the same conductive type has a gate electrode connected to an output terminal.

8. The display device according to claim 1, wherein
   the first transistor circuit includes a first and a second P channel transistors of double gate structure which are connected to the input terminal and the gate electrodes thereof being connected in common,
   the first P channel transistor has a source electrode being connected to the first fixed power supply,
   the second P channel transistor has a drain electrode being connected to the output terminal, and
   a drain electrode of the first P channel transistor and a source electrode of the second P channel transistor are connected to each other in common to be the common connection node, and the voltage of the third fixed power supply is supplied to the common connection node by the switch element.

9. The display device according to claim 1, wherein the second transistor circuit includes the first and second N channel transistors of double gate structure which are connected to the input terminal, and the gate electrodes thereof being connected in common, the first N channel transistor has a drain electrode being connected to the output terminal, the second N channel transistor has a source electrode being connected to the second fixed power supply, a source electrode of the first N channel transistor and a drain electrode of the second N channel transistor are connected to each other in common to be the common connection node, and the voltage of the third fixed power supply is supplied to the common connection node by the switch element.

10. The display device according to claim 1, wherein the output terminal is connected to an inverter circuit of a final stage.

11. The display device according to claim 10, wherein a voltage of the first fixed power supply is higher than a voltage of a positive side power supply of the inverter circuit of the final stage, and a voltage of the second fixed power supply is lower than a voltage of a negative side power supply of the inverter circuit of the final stage.

12. The display device according to claim 1, wherein the first and second transistor circuits are directly connected each other.

13. The display device according to claim 1, wherein the first and second transistor circuits are electrically connected each other.

14. An electronic equipment including a display device according to claim 1.

15. The electronic equipment according to claim 14, wherein a voltage between the first fixed power supply and the third fixed power supply, and a voltage between the third fixed power supply and the second fixed power supply are voltages within a range of a source-drain breakdown voltage of each of the transistors which is included in the first and the second transistor circuits.

16. The electronic equipment according to claim 14, wherein a voltage of the third fixed power supply is a value between the voltages of the first fixed power supply and the second fixed power supply.

17. The electronic equipment according to claim 16, wherein a voltage of the third fixed power supply is an average value of the voltages of the first fixed power supply and the second fixed power supply.

18. The electronic equipment according to claim 14, wherein a voltage of the first fixed power supply is higher than a voltage of a higher voltage side of input voltages applied to the input terminal, and a voltage of the second fixed power supply is lower than a voltage of a lower voltage side of the input voltages.

19. The electronic equipment according to claim 14, wherein the switch element is a transistor having the same conductive type as another transistor circuit which forms an inverter circuit.

20. The electronic equipment according to claim 19, wherein the transistor of the same conductive type has a gate electrode connected to an output terminal.

* * * * *